(12) United States Patent
Lin et al.

(10) Patent No.: US 10,174,535 B2
(45) Date of Patent: Jan. 8, 2019

(54) HINGE MODULE AND ELECTRONIC DEVICE USING THE SAME

(71) Applicants: Che-Hsien Lin, Taipei (TW); Che-Hsien Chu, Taipei (TW)

(72) Inventors: Che-Hsien Lin, Taipei (TW); Che-Hsien Chu, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 0 days.

(21) Appl. No.: 15/891,323

(22) Filed: Feb. 7, 2018

(65) Prior Publication Data

US 2018/0230724 A1 Aug. 16, 2018

Related U.S. Application Data

(60) Provisional application No. 62/456,629, filed on Feb. 8, 2017.

(51) Int. Cl.

| G06F 1/16 | (2006.01) |
|---|---|
| E05D 11/06 | (2006.01) |
| E05D 11/10 | (2006.01) |
| H05K 5/02 | (2006.01) |
| E05D 5/04 | (2006.01) |
| E05D 3/12 | (2006.01) |
| E05D 3/18 | (2006.01) |

(52) U.S. Cl.
CPC .......... *E05D 11/06* (2013.01); *E05D 11/1042* (2013.01); *G06F 1/1616* (2013.01); *G06F 1/1681* (2013.01); *H05K 5/0226* (2013.01); *E05D 3/122* (2013.01); *E05D 3/18* (2013.01); *E05D 5/04* (2013.01); *E05Y 2900/606* (2013.01)

(58) Field of Classification Search
CPC .................................................. G06F 1/1681
See application file for complete search history.

(56) References Cited

U.S. PATENT DOCUMENTS 9,258,914 B2    2/2016  Koser et al.
2004/0093447 A1*  5/2004  Numano ............... G06F 1/1616
                                                          710/72

(Continued)

FOREIGN PATENT DOCUMENTS

| CN | 204390111 | 6/2015 |
|---|---|---|
| TW | M477133 | 4/2014 |
| TW | M503734 | 6/2015 |

*Primary Examiner* — Adrian S Wilson
(74) *Attorney, Agent, or Firm* — JCIPRNET

(57) ABSTRACT

A hinge module assembled to a first body and a second body of an electronic device and including a first rotating shaft assembled to the first body and having a first limiting portion, a second rotating shaft movably and rotatably assembled to the second body, a linking member, a switching member, and a transmission couple is provided. The second rotating shaft is fixed to the linking member and has a second limiting portion. The first rotating shaft is rotatably assembled to the linking member. The switching member movably passes through the linking member. The first limiting portion and the second limiting portion are located at two opposite ends of a moving path of the switching member to be interfered therewith. The transmission couple is respectively disposed at the second rotating shaft and the second body.

24 Claims, 10 Drawing Sheets

(56) References Cited

U.S. PATENT DOCUMENTS

| | | | | |
|---|---|---|---|---|
| 2015/0002998 A1* | 1/2015 | Arima | ............... | G06F 1/1637 |
| | | | | 361/679.27 |
| 2015/0092331 A1* | 4/2015 | Kinoshita | ............. | G06F 1/1681 |
| | | | | 361/679.09 |
| 2015/0131218 A1* | 5/2015 | Yeh | ............... | G06F 1/1681 |
| | | | | 361/679.07 |

* cited by examiner

HINGE MODULE AND ELECTRONIC DEVICE USING THE SAME

CROSS-REFERENCE TO RELATED APPLICATION

This application claims the priority benefits of U.S. provisional application Ser. No. 62/456,629, filed on Feb. 8, 2017. The entirety of the above-mentioned patent application is hereby incorporated by reference herein and made a part of this specification.

BACKGROUND OF THE INVENTION

Field of the Invention

The disclosure relates to a hinge module and an electronic device using the hinge module.

Description of Related Art

It is known in the related art that it is possible to allow a cover or a display screen of an electronic device (e.g., a mobile phone, a laptop, a PDA, and an e-reader) to be rotatable and have opening/closing functions by providing a pivot or hinge that is reciprocating due to an external force on the electronic device.

The pivot or hinge of this type merely provides relative pivoting and opening/closing functions for machine bodies but does not accommodate practicality and esthetics in use. For example, after the display screen of the laptop is rotated and opened with respect to a system host via the hinge, an obvious structural distance (gap) becomes present between the two. For a user, such arrangement distances the display screen when the laptop is in use. Moreover, the structural distance also causes a defect in the appearance, which is unfavorable for the esthetics of the electronic device.

SUMMARY OF THE INVENTION

The embodiments of the invention provide a hinge module and an electronic device using the hinge module, in which a compact configuration is provided between bodies of the electronic device via the hinge module when the bodies are rotated and spread with respect to each other.

A hinge module according to an embodiment of the invention is configured to assemble to a first body and a second body of an electronic device, wherein the first body is adapted to be subjected to a force to be rotated and opened/closed with respect to the second body via the hinge module. The hinge module includes a first rotating shaft, a second rotating shaft, a linking member, a switching member, and a transmission couple. The first rotating shaft is assembled to the first body and includes a first limiting portion. The second rotating shaft has a first end and a second end opposite to each other. The first end is movably and rotatably assembled to the second body, and the second rotating shaft includes a second limiting portion. The first rotating shaft is rotatably assembled to the linking member. The second end of the second rotating shaft is connected to the linking member. The first rotating shaft and the second rotating shaft are located in parallel on two opposite sides of the linking member. The linking member includes a third limiting portion located on a moving path of the first limiting portion. The switching member movably passes through the linking member. The first limiting portion and the second limiting portion are located at two opposite ends of a moving path of the switching member, such that the switching member is interfered with the first limiting portion or the second limiting portion. The transmission couple is respectively disposed at the first end of the second rotating shaft and the second body. A rotating motion of the second rotating shaft with respect to the second body is transformed into a rectilinear motion of the second body with respect to the second rotating shaft via the transmission couple. When the switching member is interfered with the second limiting portion, the first rotating shaft is subjected to a force and is rotated with respect to the linking member in a first direction. After the first limiting portion and the second limiting portion are interfered with each other, the first rotating shaft and the linking member are subjected to a force and are synchronizedly rotated in the first direction via the second rotating shaft to drive the switching member to be disengaged from the second limiting portion and interfered with the first limiting portion. When the switching member is interfered with the first limiting portion, the first rotating shaft is subjected to a force and is rotated synchronizedly with the linking member in a second direction via the second rotating shaft, such that after the switching member is moved to a position corresponding to the second limiting portion, the first rotating shaft is subjected to a force and drives the switching member to be disengaged from the first limiting portion and interfered with the second limiting portion. The first direction is opposite to the second direction.

An electronic device according to an embodiment of the invention includes a first body, a second body, and a hinge module. The hinge module is assembled to the first body and the second body such that the first body and the second body are opened/closed with respect to each other via the hinge module. The hinge module includes a first rotating shaft, a second rotating shaft, a linking member, a switching member, and a transmission couple. The first rotating shaft is assembled to the first body and includes a first limiting portion. The second rotating shaft has a first end and a second end opposite to each other. The first end is movably and rotatably assembled to the second body, and the second rotating shaft includes a second limiting portion. The first rotating shaft is rotatably assembled to the linking member. The second end of the second rotating shaft is connected to the linking member. The first rotating shaft and the second rotating shaft are located in parallel on two opposite sides of the linking member. The linking member includes a third limiting portion located on a moving path of the first limiting portion. The switching member movably passes through the linking member. The first limiting portion and the second limiting portion are located at two opposite ends of a moving path of the switching member, such that the switching member is interfered with the first limiting portion or the second limiting portion. The transmission couple is respectively disposed at the first end of the second rotating shaft and the second body. A rotating motion of the second rotating shaft with respect to the second body is transformed into a rectilinear motion of the second body with respect to the second rotating shaft via the transmission couple. The switching member is interfered with the second limiting portion when the first body is closed with respect to the second body. The first rotating shaft is subjected to a force and is rotated with respect to the linking member in a process of rotating and spreading the first body with respect to the second body. After the first limiting portion and the second limiting portion are interfered with each other, the first rotating shaft and the linking member are subjected to a force and are synchronizedly rotated via the second rotating shaft in a same direction to drive the switching member to be disengaged from the second limiting portion and interfered with the first limiting portion, and the second rotating shaft drives the second body to be moved close to the first body via the transmission couple.

Accordingly, in the embodiments of the invention, the first body and the second body of the electronic device are rotated and opened/closed with respect to each other via the double-shaft hinge module. Moreover, in the hinge module, the first rotating shaft and the second rotating shaft are both assembled to the linking member, and the movable switching member is operated between the first rotating shaft and the second rotating shaft, such that the switching member is reciprocatingly moved between the first rotating shaft and the second rotating shaft along with the travel differences between the two, thereby generating interference with the first rotating shaft or interference with the second rotating shaft.

When the bodies are closed with respect to each other, the switching member is interfered with the second rotating shaft. In the process where the first body is spread with respect to the second body, the first rotating shaft is interfered with the linking member first to cause the first rotating shaft and the linking member to be synchronizedly rotated via the second rotating shaft and thereby drive the switching member to be disengaged from the limiting portion of the second rotating shaft and interfered with the limiting portion of the first rotating shaft instead. Meanwhile, through the transmission couple disposed between the second rotating shaft and the second body, the relative rotating motion between the second rotating shaft and the second body is transformed by the transmission couple into the relative rectilinear motion between the two, thereby driving the second body to move towards the first body in the process of rotating the second rotating shaft.

Therefore, the driving process of the hinge module generates the rotating and moving effect, such that as the first body is rotated with respect to the second body, the first body and the second body are also moved towards or away from each other. As a result, the bodies in the spread state exhibit a compact structural configuration, which enhances the esthetics of the electronic device in use.

To provide a further understanding of the aforementioned and other features and advantages of the disclosure, exemplary embodiments, together with the reference drawings, are described in detail below.

DESCRIPTION OF THE EMBODIMENTS

Figure 1A:
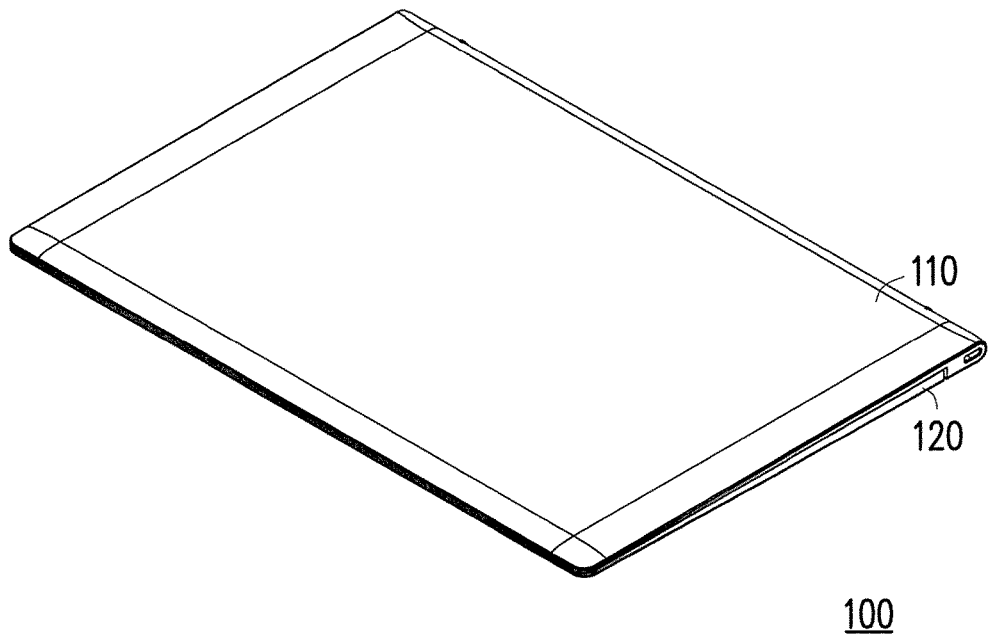
FIG. 1A and FIG. 1B are schematic diagrams respectively illustrating an electronic device from different angles of view.
Figure 1B:
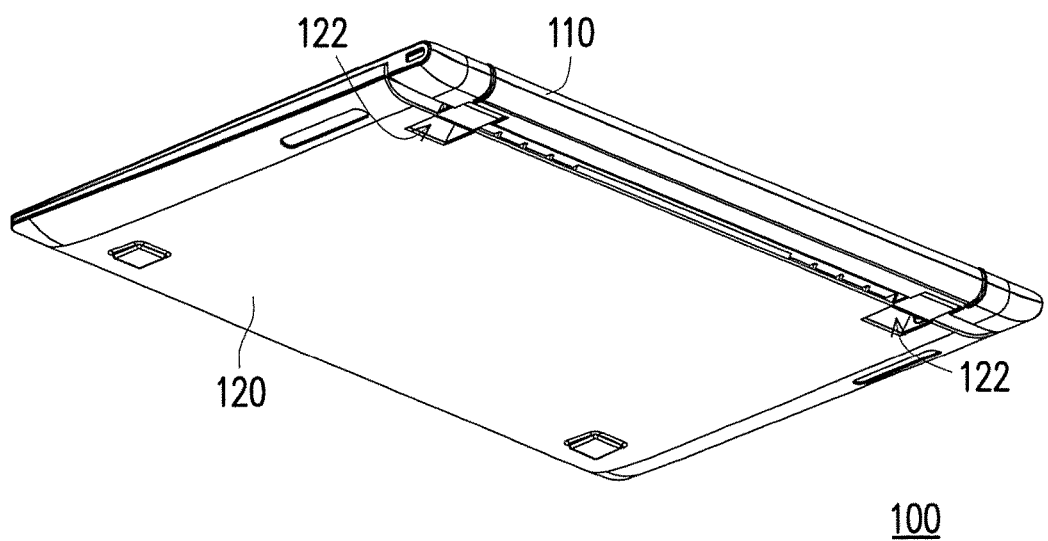
Figure 2A:
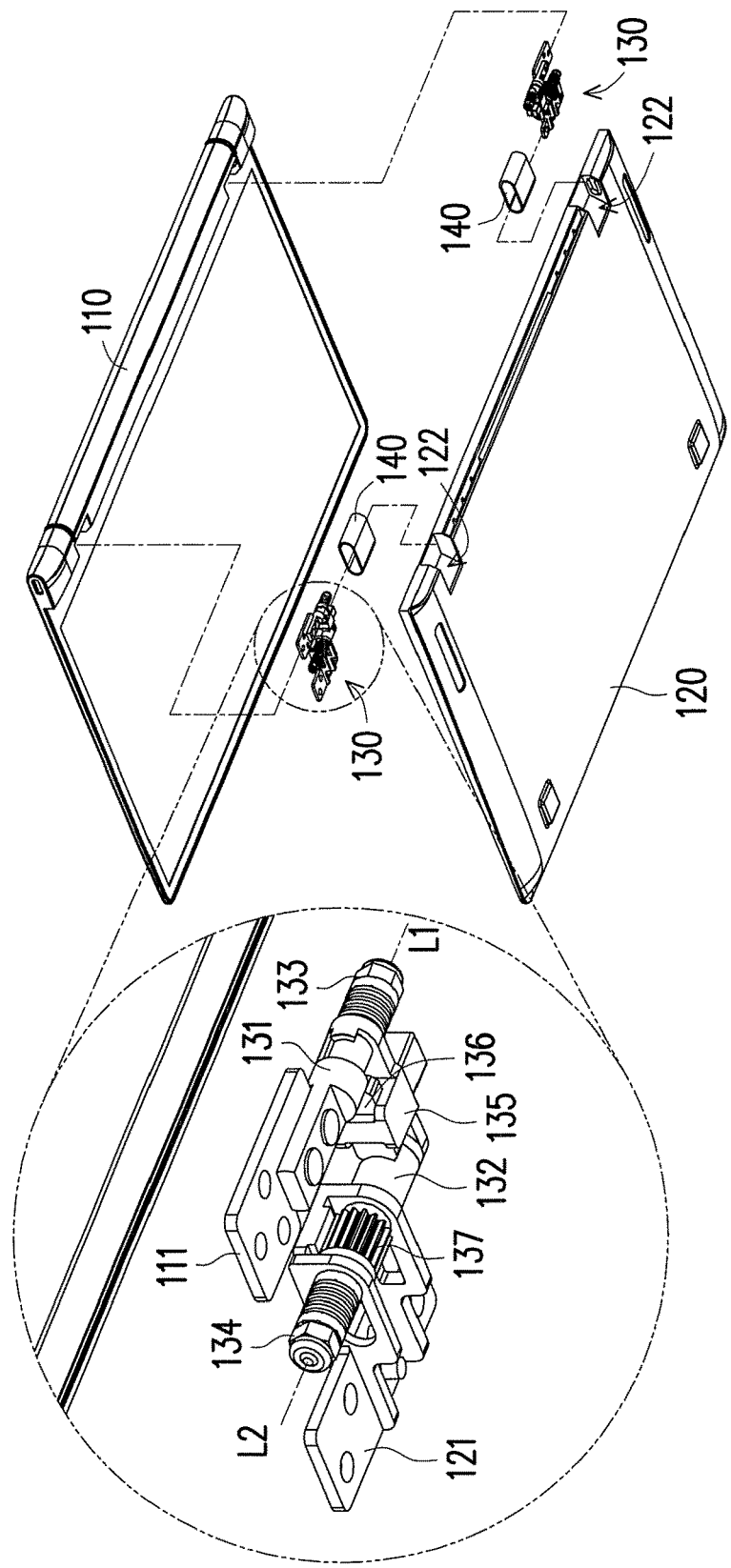
FIG. 2A to FIG. 2C are exploded schematic diagrams illustrating an electronic device in different states.
Figure 2B:
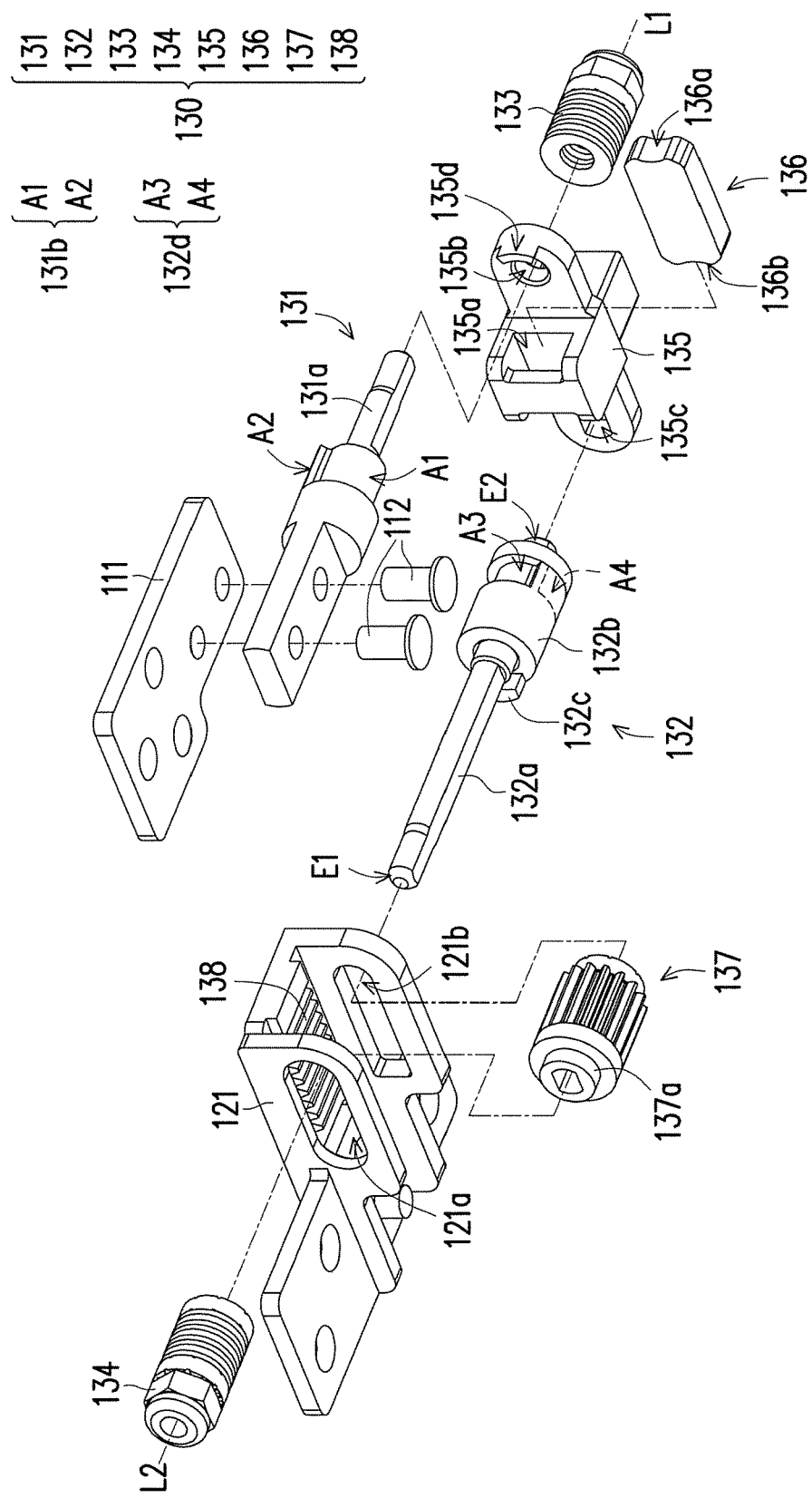
Figure 2C:
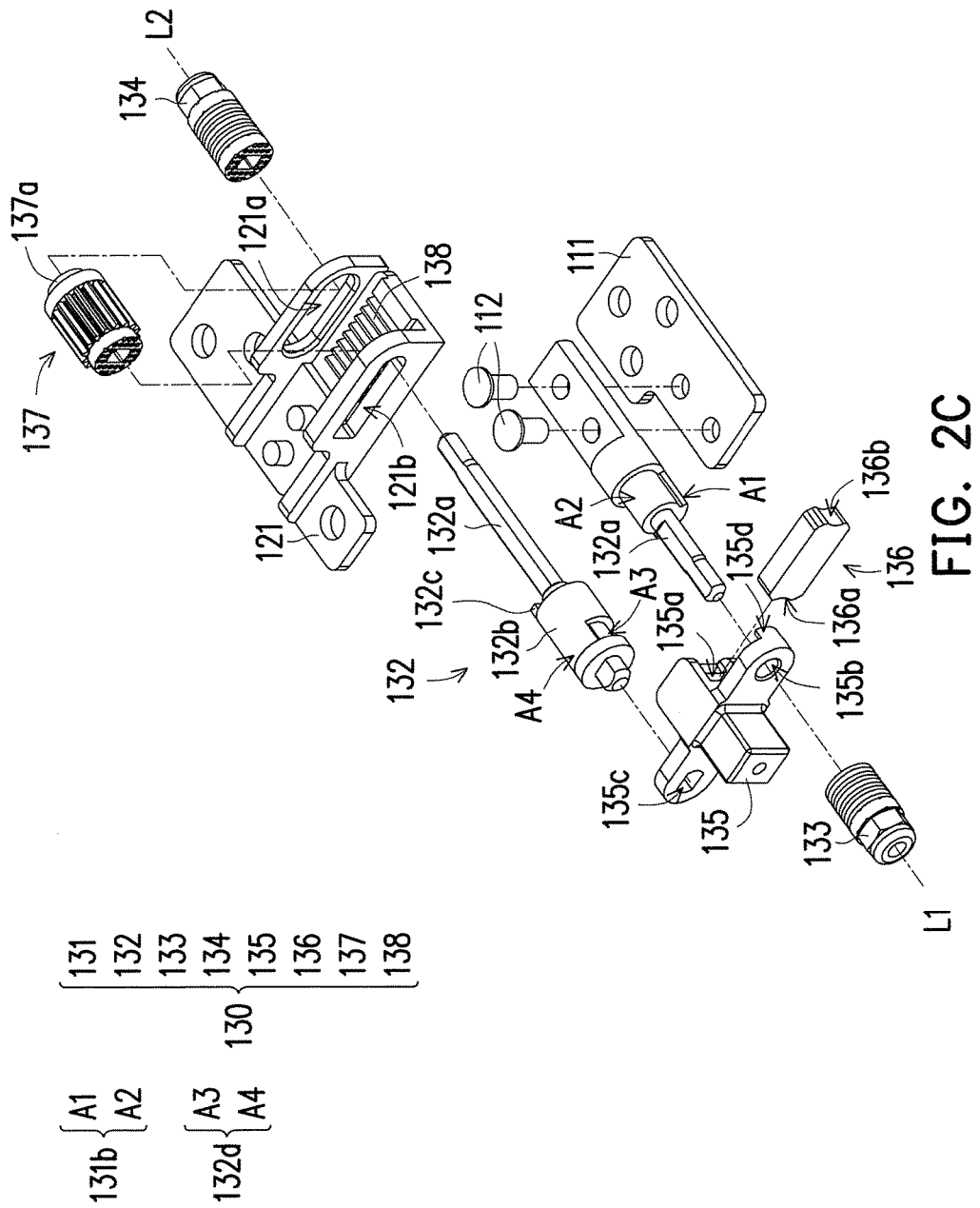

FIG. 1A and FIG. 1B are schematic diagrams respectively illustrating an electronic device from different angles of view. FIG. 2A to FIG. 2C are exploded schematic diagrams illustrating an electronic device in different states. Referring to FIG. 1A, FIG. 1B, and FIG. 2A first, in the present embodiment, an electronic device 100 is, for example, a laptop computer and includes a first body 110 (e.g., a display screen), a second body 120 (e.g., a system host), a hinge module 130, and a cover lid 140. The hinge module 130 is assembled to the first body 110 and the second body 120 such that the first body 110 and the second body 120 can be rotated and opened/closed with respect to each other via the double-shaft hinge module 130. A portion of the hinge module 130 exposed out of a recess 122 of the second body 120 is shielded by the cover lid 140 to maintain esthetics of the electronic device 100.

In the present embodiment, FIG. 2B and FIG. 2C are exploded views illustrating the hinge module 130 from different angles of view. Referring to FIG. 2A to FIG. 2C first, in the present embodiment, the hinge module 130 includes a first rotating shaft 131, a second rotating shaft 132, torsion assemblies 133 and 134, a linking member 135, a switching member 136, and a transmission couple. The first rotating shaft 131 is assembled to a bracket 111 of the first body 110 via a fixing member 112 to allow the first body 110 to be operated in a rotating motion mode about an axis L1 with respect to the second body 120 via the first rotating shaft 131. Meanwhile, the torsion assembly 133 is assembled to the first rotating shaft 131 to provide a supporting torsion required for the first body 110 to be rotated or opened/closed with respect to the second body 120. The second rotating shaft 132 has a first end E1 and a second end E2 opposite to each other. The second body 120 further includes a bracket 121. The first end E1 passes through slide grooves 121a, 121b of the bracket 121 to be assembled to the torsion assembly 134. Therefore, the second rotating shaft 132 rotates about an axis L2 and sliding along the slide grooves 121a, 121b with respect to the second body 120.

Moreover, the first rotating shaft 131 and the second rotating shaft 132 are connected in parallel to two opposite sides of the linking member 135 to connect motion modes of the first rotating shaft 131 and the second rotating shaft 132 via the linking member 135. More specifically, the first rotating shaft 131 passes through an opening 135b of the linking member 135 along the axis L1 to be connected to the torsion assembly 133 to cause the first rotating shaft 131 to generate a rotating motion with respect to the linking member 135. The second end E2 of the second rotating shaft 132 is connected to an opening 135c of the linking member 135, such that the second rotating shaft 132 and the linking member 135 are fixed to each other. Therefore, the linking member 135 can generate a rotating motion mode and a sliding motion mode with respect to the second body 120 via the second rotating shaft 132.

In addition, the first rotating shaft 131 further includes a first limiting portion 131b, and the linking member 135 includes a third limiting portion 135d. The third limiting portion 135d is located on a moving path of the first limiting portion 131b to allow the first limiting portion 131b and the third limiting portion 135d to be interfered with each other after the first rotating shaft 131 is rotated for a specific travel with respect to the linking member 135 to thereby create an effect of stopping the first rotating shaft 131 from continuing rotating. It is noted that the specific travel here may be adequately adjusted according to the requirement.

The first rotating shaft 131 includes a shaft portion 131a and the first limiting portion 131b, and the first limiting portion 131b is substantially formed of a first shaft surface A1 and a second shaft surface A2 having different shaft diameters. Here, the shaft diameter of the first shaft surface A1 is smaller than the shaft diameter of the second shaft surface A2. In other words, due to the first shaft surface A1 and the second shaft surface A2, a portion of the first rotating shaft 131 forms a cam-like structure, and relevant actuations are generated based on its correspondence to the switching member 136 and the third limiting portion 135d. Specifically, the third limiting portion 135*d* is substantially in contact with the first shaft surface A1. Moreover, due to a step structure between the first shaft surface A1 and the second shaft surface A2, the first rotating shaft 131 is interfered with the third limiting portion 135*d* after being rotated for the specific travel.

The second rotating shaft 132 includes a shaft portion 132*a* and a sleeve member 132*b*. The shaft portion 132*a* has the first end E1 and the second end E2. The sleeve member 132*b* is fit around the shaft portion 132*a* and exposes a portion of the shaft portion 132*a* to form a third shaft surface A3, which has a shaft diameter different from a portion, i.e., a fourth shaft surface A4, of the sleeve member 132*b*. In other words, the second rotating shaft 132 forms a cam-like structure in a portion where the third shaft surface A3 and the fourth shaft surface A4 are located. Here, the shaft diameter of the third shaft surface A3 is smaller than the shaft diameter of the fourth shaft surface A4. It is noted that the sleeve member 132*b* further includes a protrusion 132*c* that extends to the slide groove 121*b* of the bracket 121. Therefore, in the process where the shaft portion 132*a* rotates and slides along the slide grooves 121*a*, 121*b*, the sleeve member 132*b* is moved with the shaft portion 132*a* along the slide groove 121*b* via the protrusion 132*c*, but the protrusion 132*c* prevents the sleeve member 132*b* from rotating with the shaft portion 132*a*. In other words, as the second rotating shaft 132 is rotated about the axis L2, the fourth shaft surface A4 on the sleeve member 132*b* is not rotated along but remains stationary. Accordingly, different portions of the surface of the shaft portion 132*a* are used as the third shaft surface A3. In other words, different portions of the shaft portion 132*a* and the portion of the sleeve member form a second limiting portion 132*d* of the second rotating shaft 132. By configuring the sleeve member 132*b* not to rotate about the axis L2 along with the shaft portion 132*a*, the second limiting portion 132*d* formed of the third shaft surface A3 and the fourth shaft surface A4 are regarded as a structure that is not rotated on the axis L2 along with the second rotating shaft 132.

On the other hand, the switching member 136 movably passes through an opening 135*a* of the linking member 135. Here, a penetration direction of the opening 135*a* is orthogonal to a penetration direction of the opening 135*b* and is also orthogonal to a penetration direction of the opening 135*c*. In other words, a moving path of the switching member 136 is substantially orthogonal to the first rotating shaft 131 (the axis L1) and the second rotating shaft 132 (the axis L2). Moreover, the first limiting portion 131*b* and the second limiting portion 132*d* are located at two opposite ends of the moving path of the switching member 136. In other words, the switching member 136 is reciprocatingly moved between the first limiting portion 131*b* and the second limiting portion 132*d*. As mentioned above, the second limiting portion 132*d* is regarded as the structure that is not moved along with the shaft portion 132*a*. In the present embodiment, the recess (i.e., the third shaft surface A3) of the second limiting portion 132*d* is substantially permanently facing the switching member 132 and is thus different from the first limiting portion 131*b*, which may be rotated along with the shaft portion 131*a*.

Here, the switching member 136 has side faces 136*a* and 136*b* opposite to each other, and surface contours of the side faces 136*a* and 136*b* are substantially consistent with a surface contour of the first shaft surface A1 of the first rotating shaft 131 (the first limiting portion 131*b*) and a surface contour of the third shaft surface A3 of the second rotating shaft 132 (the second limiting portion 132*d*). Therefore, when the switching member 136 is moved such that its side face 136*a* is structurally abutted against the first shaft surface A1, the switching member 136 is interfered with the first rotating shaft 131 and prevents the first rotating shaft 131 from rotating about the axis L1 any further. When the switching member 136 is moved such that its side face 136*b* is structurally abutted against the third shaft surface A3, the switching member 136 is interfered with the second rotating shaft 132 and prevents the second rotating shaft 132 from rotating about the axis L2 any further.

FIG. 3A to FIG. 3E illustrate different open/closed states of an electronic device. FIG. 4A to FIG. 4E illustrate different rotating states of a hinge module. Referring to FIG. 3A to FIG. 3D corresponding to FIG. 4A to FIG. 4D, in the present embodiment, open/closed states of the first body 110 and the second body 120 of the electronic device 100 as shown in FIG. 3A to FIG. 3D respectively correspond to the rotating states of the hinge module 130 as shown in FIG. 4A to FIG. 4D. Here, a first direction D1 (i.e., a process of transition from FIG. 3A to FIG. 3D, or a clockwise direction of the drawing) represents a direction in which the first body 110 is rotated and spread with respect to the second body 120. A second direction D2 (i.e., a process from FIG. 3D to FIG. 3A, or a counterclockwise direction of the drawing) represents a direction in which the first body 110 is rotated and closed with respect to the second body 120. Specifically, the first direction D1 is opposite to the second direction D2.

Figure 3A:
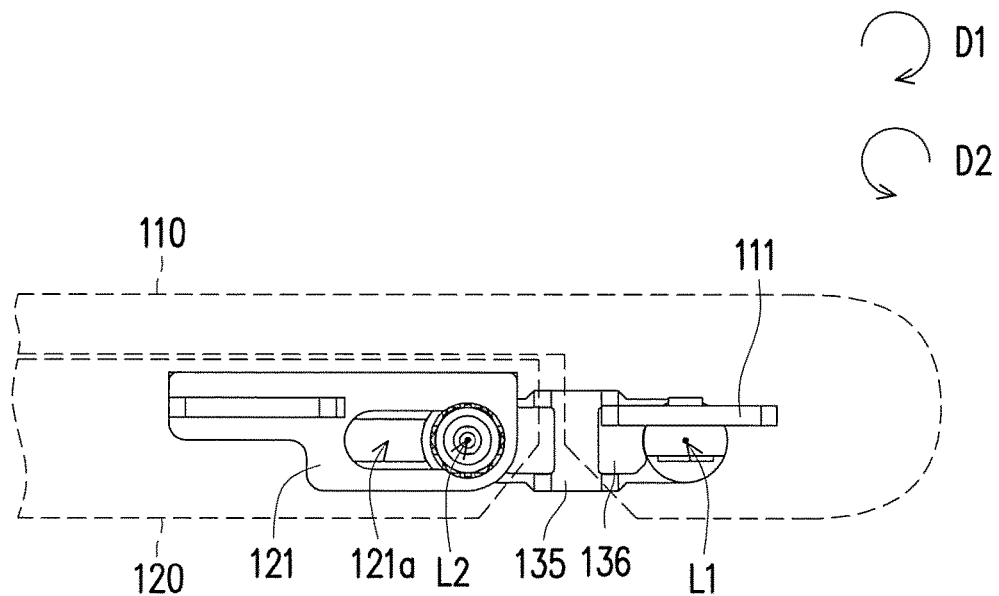
FIG. 3A to FIG. 3E illustrate different open/closed states of an electronic device.
Figure 4A:
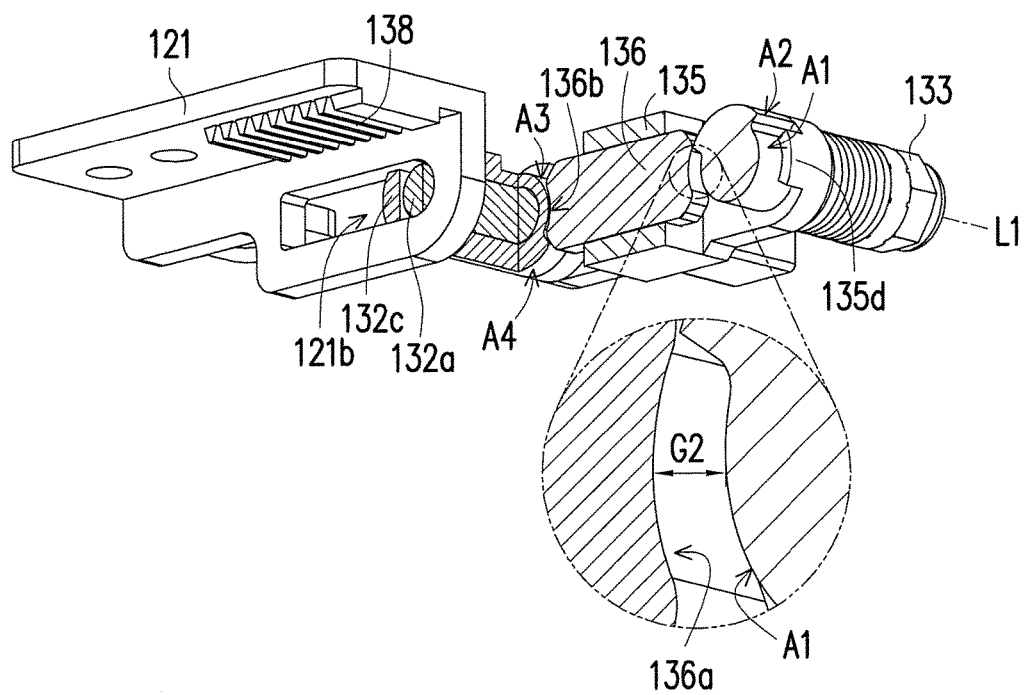
FIG. 4A to FIG. 4E illustrate different rotating states of a hinge module.

When the first body 110 and the second body 120 are in a closed state as shown in FIG. 3A, the hinge module 130 is as shown in FIG. 4A, where the side face 136*b* of the switching member 136 is abutted against the third shaft surface A3 of the second rotating shaft 132. Therefore, the switching member 136 and the second rotating shaft 132 are interfered with each other such that the second rotating shaft 132 cannot be rotated about the axis L2. At this time, the shaft portion 132*a* of the second rotating shaft 132 and the protrusion 132*c* of the sleeve member 132*b* are substantially located at one end of the slide groove 121*b* (at the right end of the slide groove 121*b* as shown in FIG. 4A). Conversely, a gap G2 is presented between the side face 136*a* of the switching member 136 and the first shaft surface A1 of the first rotating shaft 131. This means that the switching member 136 and the first limiting portion 131*b* of the first rotating shaft 131 are in a disengaged state and do not interfere with each other. Therefore, the first rotating shaft 131 can still successfully be rotated about the axis L1 with respect to the linking member 135.

Figure 3B:
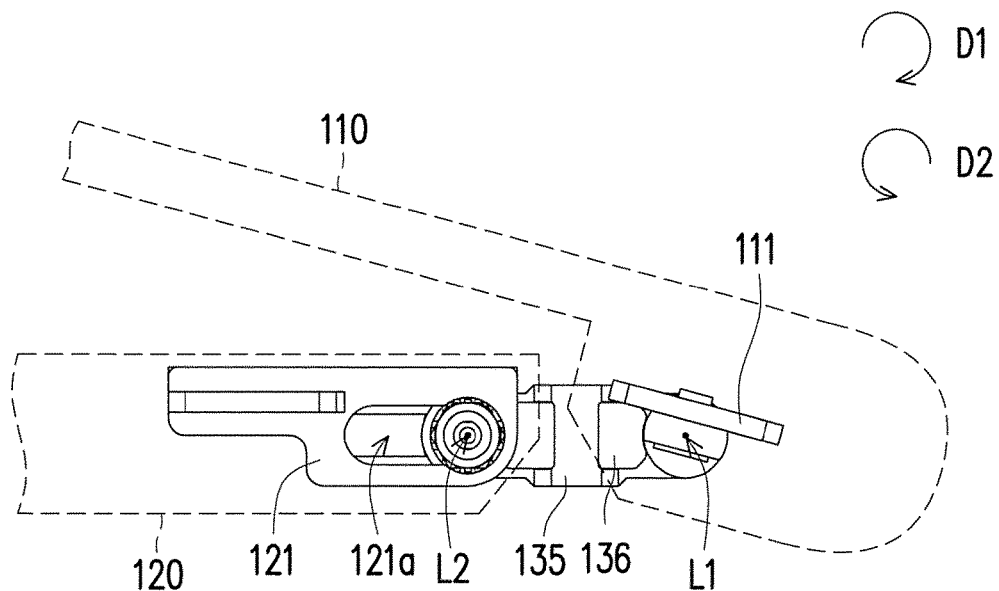

Next, as shown by a process from FIG. 3A to FIG. 3B, a user may apply a force to the first body 110 to rotate and spread it in the first direction D1 with respect to the second body 120. At this time, the hinge module 130 undergoes a process as shown from FIG. 4A to FIG. 4B, where the first rotating shaft 131 is rotated about the axis L1 for a specific travel with respect to the linking member 135 until the step structure (i.e., the step structure between the first shaft surface A1 and the second shaft surface A2) of the first limiting portion 131*b* and the third limiting portion 135*d* of the linking member 135 are interfered with each other. It is noted that, at this time, the switching member 136 remains interfered with the second rotating shaft 132. Therefore, the force applied by the user merely causes the rotating actuation of the first rotating shaft 131 as described above, and the second rotating shaft 132 remains in a non-rotating state.

Figure 3C:
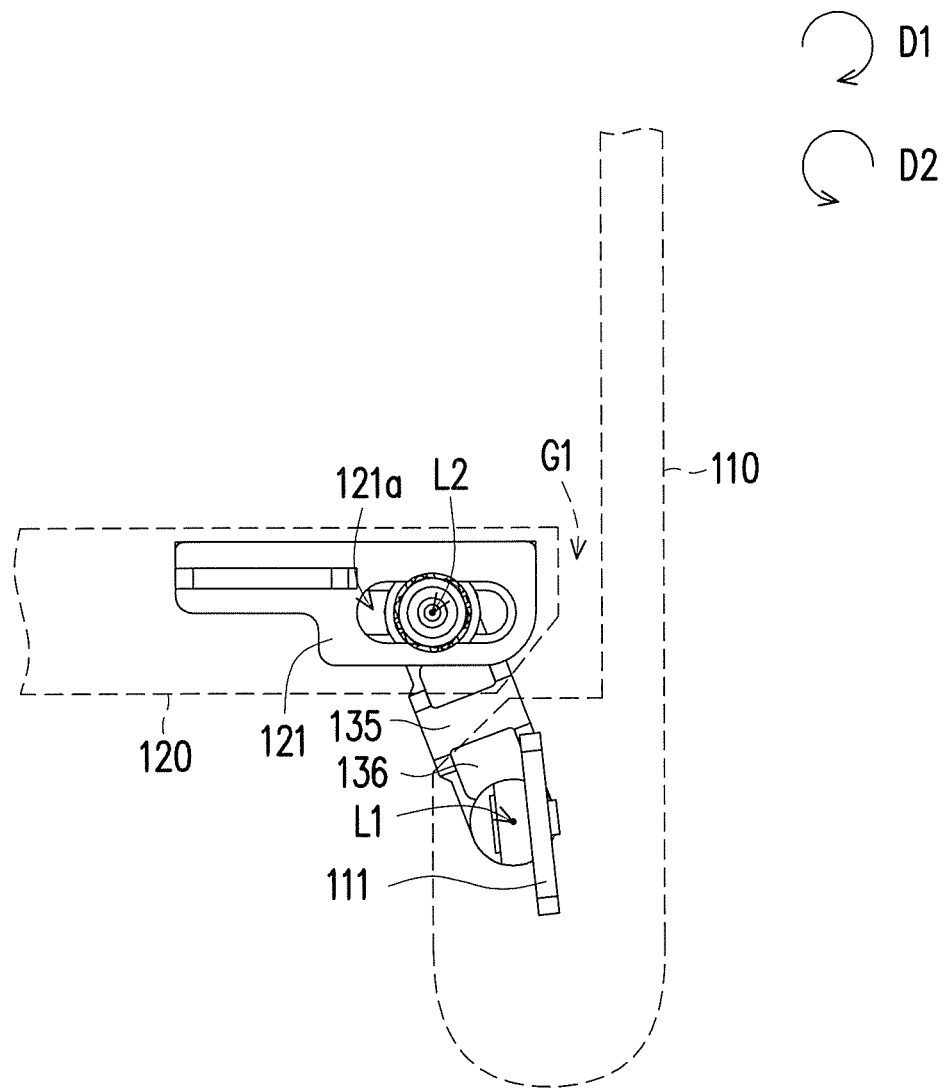

Then, referring to FIG. 3B to FIG. 3C, the first body 110 is spread to a position close to 90 degrees with respect to the second body 120. Meanwhile, a gap G1 is formed between the first body 110 and the second body 120, and the hinge module 130 undergoes a process as shown from FIG. 4B to FIG. 4C. Since the first limiting portion 131b of the first rotating shaft 131 and the third limiting portion 135d of the linking member 135 are already interfered with each other, when the first body 110 continues to rotate in the first direction D1, the first rotating shaft 131 is not rotated with respect to the linking member 135 any further. Instead, the first rotating shaft 131 and the linking member 135 form an integral structure and are rotated together in the first direction D1. Accordingly, as the force applied by the user cannot rotate the first rotating shaft 131 in the first direction D1, the step structure of the second limiting portion 132d (i.e., the step structure between the third shaft surface A3 and the fourth shaft surface A4) becomes an object for the applied force to overcome. In other words, compared to the first rotating shaft 131 which cannot be rotated any further in the first direction D1 due to interference with the linking member 135, if the user continues to apply the force and rotate the first body 110 along the first direction D1, the switching member 136 is able to overcome the step structure between the third shaft surface A3 and the fourth shaft surface A4. Accordingly, the side face 136b of the switching member 136 is no longer structurally abutted against the third shaft surface A3 (due to the force applied by the user) and is disengaged from the step structure of the second limiting portion 132d of the second rotating shaft 132, and is moved to a position abutted against the fourth shaft surface A4 as shown in FIG. 4C. At this time, the second shaft surface A2 is substantially sandwiched between the switching member 136 and the third limiting portion 135d to achieve the effect of preventing the first rotating shaft 131 from rotating due to interference between the first limiting portion 131b and the third limiting portion 135d.

In other words, the integral structure formed of the first rotating shaft 131 and the linking member 135 are able to be synchronizedly rotated in the first direction D1 via the second rotating shaft 132 at this time and drive the switching member 136 to be disengaged from the second limiting portion 132d. Briefly speaking, the cam-like structure of the second rotating shaft 132 pushes the switching member 136 away, and this actuation means that the switching member 136 is moved towards the first rotating shaft 131, which causes the switching member 136 to be abutted against the first limiting portion 131b (namely, to be structurally abutted against the first shaft surface A1 of the first rotating shaft 131 by the side face 136a instead). Accordingly, the interference between the switching member 136 and the second rotating shaft 132 is removed, and interference between the switching member 136 and the first rotating shaft 131 is generated instead.

It is noted that, referring to FIG. 2B and FIG. 2C again, the transmission couple of the present embodiment includes a gear rack 138 and a gear 137 coupled to each other. The gear rack 138 is disposed on an inner surface of the bracket 121 of the second body 120 and is located between the slide grooves 121a, 121b. The gear 137 is fit around the shaft portion 132a of the second rotating shaft 132 and is rotated about the axis L2 along with the second rotating shaft 132. Meanwhile, a protrusion 137a of the gear 137 is rotatably coupled to the slide groove 121a and is connected to the torsion assembly 134. Accordingly, in a process from FIG. 3B to FIG. 3D (i.e., from FIG. 4B to FIG. 4D), the rotation of the second rotating shaft 132 with respect to the second body 120 can generate a rectilinear motion between the second rotating shaft 132 and the second body 120 (or its second bracket 121) along the slide grooves 121a, 121b through operation of the gear 137 and the gear rack 138 together.

Figure 3D:
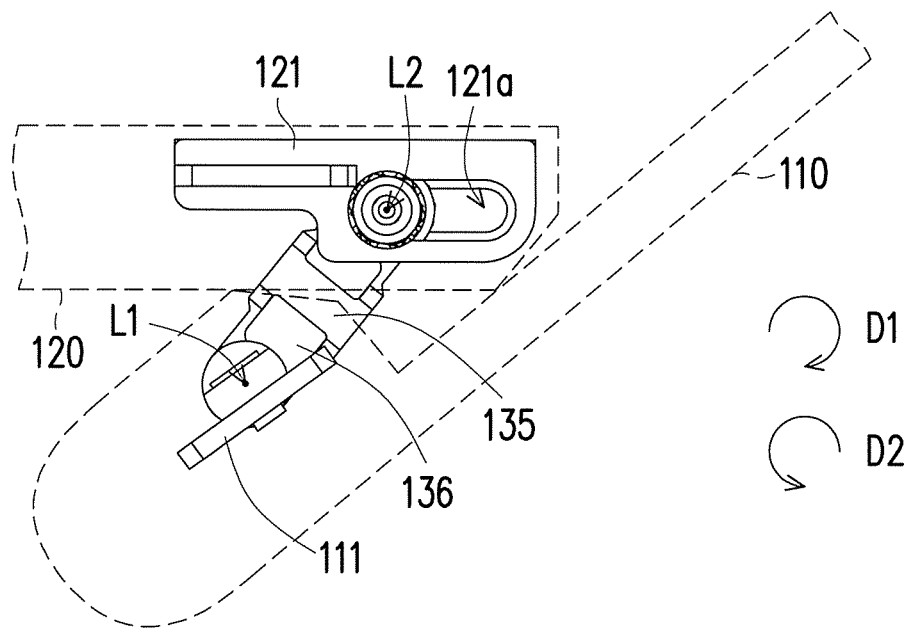
Figure 4B:
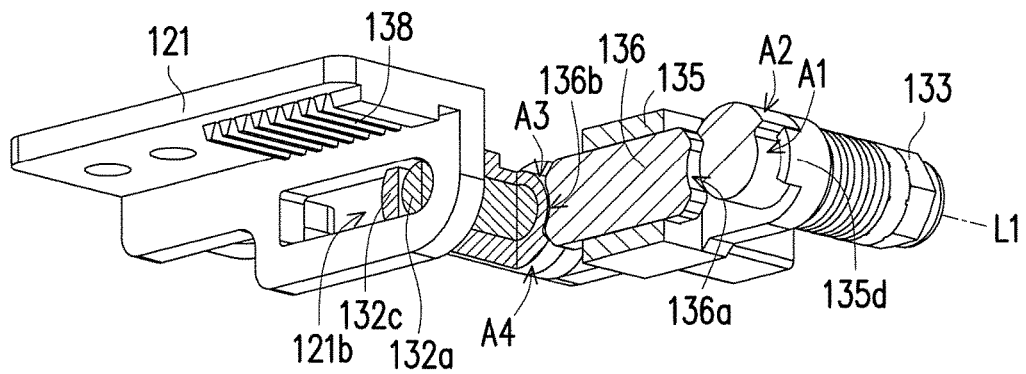
Figure 4C:
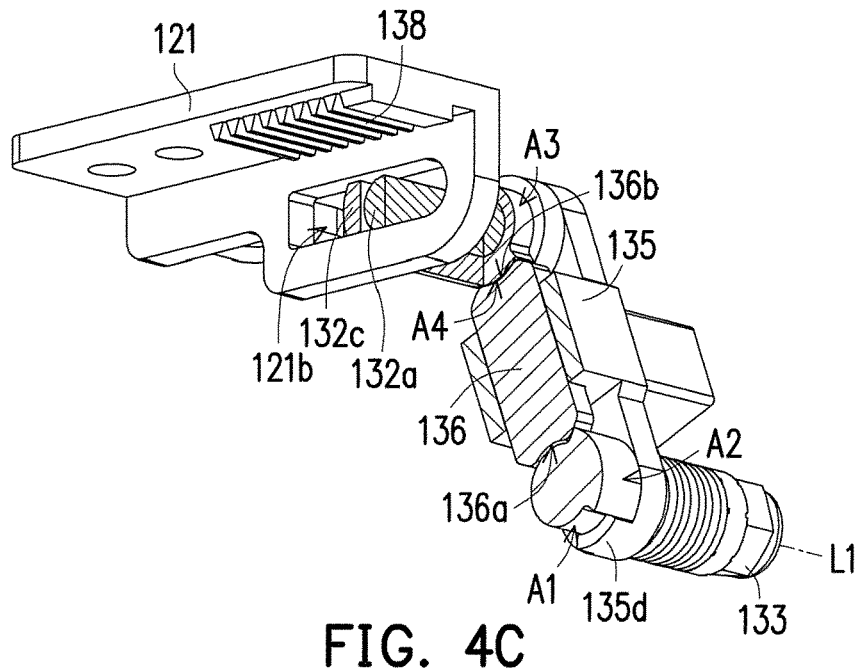
Figure 4D:
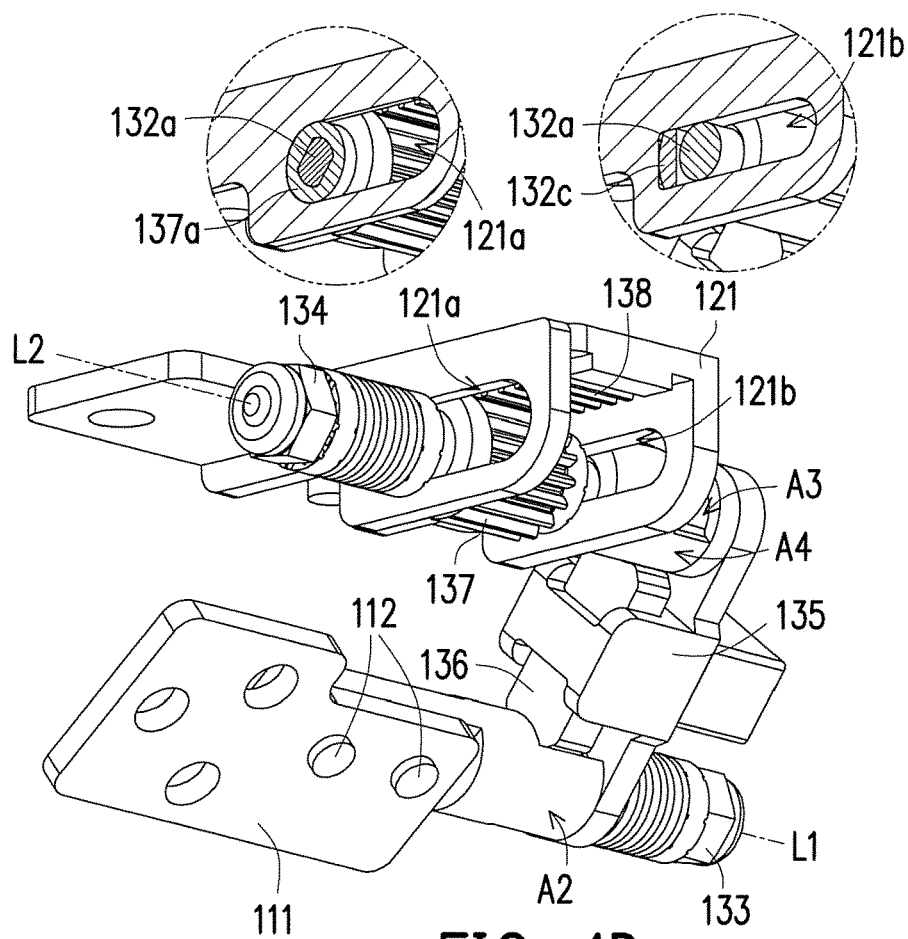

Therefore, in the process from FIG. 3B, FIG. 3C, to FIG. 3D, the hinge module 130 undergoes the process as shown from FIG. 4B, FIG. 4C, to FIG. 4D. In the process of rotating about the axis L2, the second rotating shaft 132 is moved from one end to the other opposite end of the slide grooves 121a, 121b via the transmission couple until it is in the state of FIG. 4D. Namely, as shown in the two partially enlarged views in FIG. 4D, the protrusion 137a is abutted against the left end of the slide groove 121a and the protrusion 132c is abutted against the left end of the slide groove 121b, such that the slide grooves 121a, 121b stop the second rotating shaft 132 and further stop the spreading operation of the first body 110 and the second body 120. In other words, the stopping relationship between the slide grooves 121a, 121b and the second rotating shaft 132 provides limiting effect on the first body 110 at the time of rotating and spreading with respect to the second body 120, such that FIG. 3D shows a maximum spreading angle of the electronic device 100 of the present embodiment. It is noted that the maximum spreading angle of the electronic device 100 may be changed by adequately designing the slide grooves 121a, 121b.

From another perspective, as the user intends to close the first body 110 to the second body 120, a force is applied to the first body 110 to perform the foregoing operations through reverse means. Namely, a process from FIG. 3D to FIG. 3A and a process from FIG. 4D to 4A are performed in the second direction D2, and the actuations are actuations reverse to the spreading process and shall not be repeatedly described here.

Figure 3E:
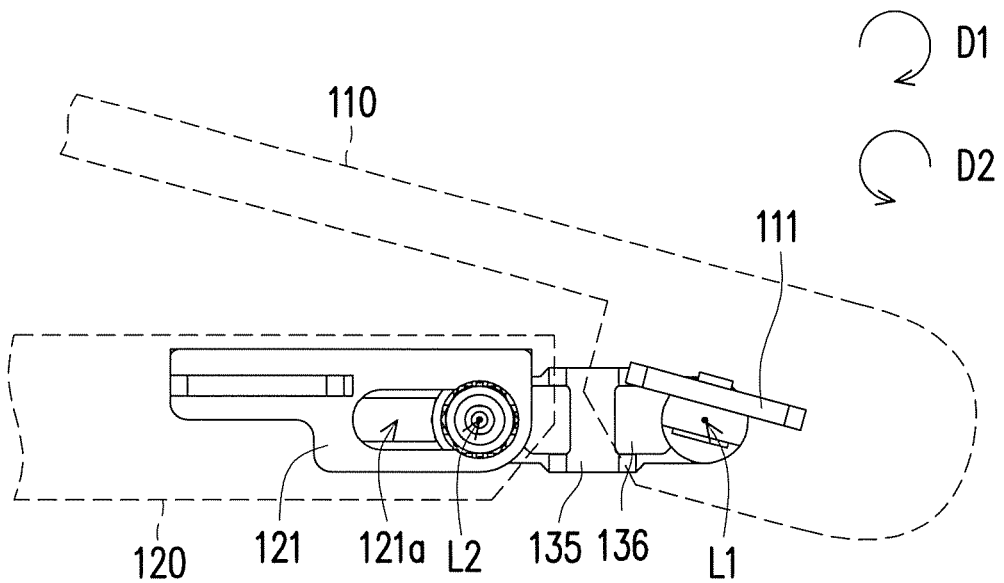
Figure 4E:
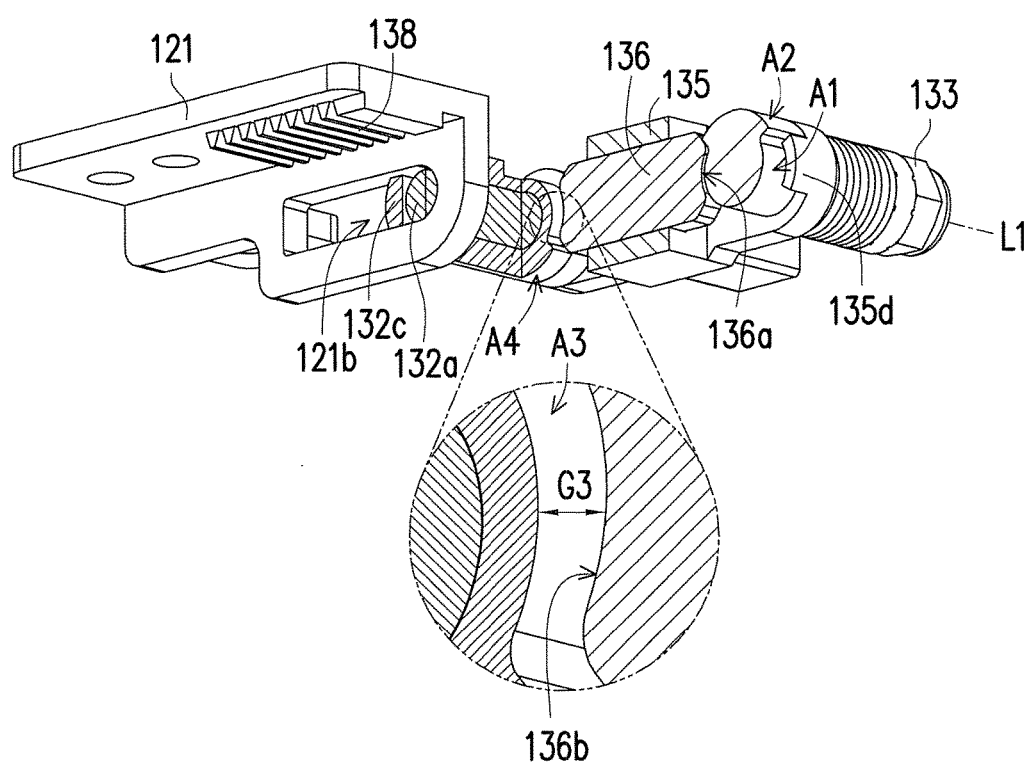

It is noted that in the process of transition from FIG. 3C to FIG. 3B (transition from FIG. 4C to FIG. 4B), the hinge module 130 is first in the state as shown in FIG. 3E and FIG. 4E. Namely, the second rotating shaft 132 is abutted against one end of the slide grooves 121a, 121b (FIG. 4E shows the right end of the slide groove 121b as an example; the same applies to the slide groove 121a but is not shown here) and generates interference. This means that the hinge module 130 cannot be rotated any further in the second direction D2. However, as the first rotating shaft 131 and the linking member 135 are synchronizedly rotated at this time, the switching member 136 is moved to a position corresponding to the third shaft surface A3 of the second rotating shaft 132, and the side face 136b directly faces the third shaft surface A3 but a gap G3 is maintained, as shown in FIG. 4E. However, the switching member 136 is still structurally abutted against the first shaft surface A1 by its side face 136a. Accordingly, as the user continues to apply the force to the first body 110 to rotate it in the second direction D2, due to the interference between the second rotating shaft 132 and the slide grooves 121a, 121b, the second rotating shaft 132 is not rotated any further but allows the applied force to drive the first limiting portion 131b. Namely, the step structure between the first shaft surface A1 and the second shaft surface A2 pushes the switching member 136 away to cause the side face 136a to be disengaged from the first shaft surface A2. Therefore, the switching member 136 is disengaged from the first limiting portion 131b and is moved towards the second rotating shaft 132, as shown in the process from FIG. 4E to FIG. 4B, such that the side face 136b is again abutted against the third shaft surface A3, and the state of interference between the switching member 136 and the second limiting portion 132d of the second rotating shaft 132 is restored. Lastly, as the user continues to apply the force to the first body 110 to drive it to continue rotating along the second direction D2 (FIG. 3B to FIG. 3A), the hinge module 130 is restored from the state of FIG. 4B to the state of FIG. 4A, and the electronic device 100 is restored to the closed state. In other words, in the process from FIG. 3E to FIG. 3B, the first body 110 and the second body 120 remain in the same state (namely, the state shown in FIG. 3E is identical to that shown in FIG. 3B), but the hinge module 130 undergoes a transition process from FIG. 4E to FIG. 4B.

Generally, as shown in FIG. 3C, in the process where the first body 110 is spread with respect to the second body 120, the gap G1 is formed between the two. In the hinge structure of the related art, such gap G1 is always present, which is unfavorable for the overall esthetics of the electronic device 100. In contrast, in the hinge module 130 shown in the embodiments of the invention, through correspondences among relevant components, the second body 120 is moved towards the first body 110 in the spreading process, and such arrangement eliminates the gap G1 and results in the compact configuration as shown in FIG. 3D. In addition to eliminating the visual difference of distanced components, such arrangement further shields the structural frame at the bottom of the first body 110 (i.e., the display screen) by the second body 120, so the display device can exhibit a narrow-edge visual effect.

In summary of the above, in the embodiments of the invention, the first body and the second body of the electronic device are rotated and opened/closed with respect to each other via the double-shaft hinge module. Moreover, in the hinge module, the first rotating shaft and the second rotating shaft are both assembled to the linking member, and the movable switching member is operated between the first rotating shaft and the second rotating shaft, such that the switching member is reciprocatingly moved between the first rotating shaft and the second rotating shaft along with the travel differences between the two, thereby generating interference with the first rotating shaft or interference with the second rotating shaft.

Accordingly, when the bodies are closed with respect to each other, the switching member is interfered with the second rotating shaft. In the process where the first body is spread with respect to the second body, the first rotating shaft is interfered with the linking member first to cause the first rotating shaft and the linking member to be synchronizedly rotated via the second rotating shaft and thereby drive the switching member to be disengaged from the limiting portion of the second rotating shaft and interfered with the limiting portion of the first rotating shaft instead. Meanwhile, through the transmission couple disposed between the second rotating shaft and the second body, the relative rotating motion between the second rotating shaft and the second body is transformed by the transmission couple into the relative rectilinear motion between the two, thereby driving the second body to move towards the first body in the process of rotating the second rotating shaft.

Therefore, the driving process of the hinge module generates the rotating and moving effect, such that as the first body is rotated with respect to the second body, the first body and the second body are also moved towards or away from each other. As a result, the bodies in the spread state exhibit a compact structural configuration, which enhances the esthetics of the electronic device in use.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A hinge module configured to assemble to a first body and a second body of an electronic device, wherein the first body is adapted to be forced to be rotated and opened/closed with respect to the second body via the hinge module, the hinge module comprising:
   a first rotating shaft assembled to the first body and comprising a first limiting portion;
   a second rotating shaft having a first end and a second end opposite to each other, wherein the first end is movably and rotatably assembled to the second body, and the second rotating shaft comprises a second limiting portion;
   a linking member, wherein the first rotating shaft is rotatably assembled to the linking member, the second end of the second rotating shaft is connected to the linking member, the first rotating shaft and the second rotating shaft are located in parallel on two opposite sides of the linking member, and the linking member comprises a third limiting portion located on a moving path of the first limiting portion;
   a switching member movably passing through the linking member, wherein the first limiting portion and the second limiting portion are located at two opposite ends of a moving path of the switching member, such that the switching member is interfered with the first limiting portion or the second limiting portion; and
   a transmission couple respectively disposed at the first end of the second rotating shaft and the second body, wherein a rotating motion of the second rotating shaft with respect to the second body is transformed into a rectilinear motion of the second body with respect to the second rotating shaft via the transmission couple,
   wherein when the switching member is interfered with the second limiting portion, the first rotating shaft is forced and rotated with respect to the linking member in a first direction, and after the first limiting portion and the second limiting portion are interfered with each other, the first rotating shaft and the linking member are forced and synchronizedly rotated in the first direction via the second rotating shaft to drive the switching member to be disengaged from the second limiting portion and interfered with the first limiting portion,
   wherein when the switching member is interfered with the first limiting portion, the first rotating shaft is forced and rotated synchronizedly with the linking member in a second direction via the second rotating shaft, such that after the switching member is moved to a position corresponding to the second limiting portion, the first rotating shaft is forced and drives the switching member to be disengaged from the first limiting portion and interfered with the second limiting portion, wherein the first direction is opposite to the second direction.

2. The hinge module according to claim 1, wherein the first limiting portion is rotated along with the first rotating shaft, and the second limiting portion is not rotated along with the second rotating shaft.

3. The hinge module according to claim 1, wherein the first rotating shaft comprises a first shaft surface and a second shaft surface having different shaft diameters, and the first shaft surface and the second shaft surface form the first limiting portion.

4. The hinge module according to claim 1, wherein the second rotating shaft comprises a third shaft surface and a fourth shaft surface having different shaft diameters, and the third shaft surface and the fourth shaft surface form the second limiting portion.

5. The hinge module according to claim 1, wherein the moving path of the switching member is orthogonal to the first rotating shaft and the second rotating shaft.

6. The hinge module according to claim 1, wherein the second rotating shaft comprises:
   a shaft portion movably and rotatably assembled to the second body; and
   a sleeve member fit around the shaft portion, wherein a portion of the shaft portion and a portion of the sleeve member form the second limiting portion.

7. The hinge module according to claim 6, wherein the sleeve member comprises a protrusion extending to a slide groove of the second body, the shaft portion is moved and rotated along the slide groove, the sleeve member is moved with the shaft portion along the slide groove via the protrusion, and the protrusion stops the sleeve member from rotating along with the shaft portion.

8. The hinge module according to claim 7, wherein different portions of the shaft portion and the portion of the sleeve member form the second limiting portion.

9. The hinge module according to claim 1, wherein the transmission couple comprises a gear rack and a gear coupled to each other, the gear rack is disposed on the second body, and the gear is fit around the second rotating shaft to be rotated along with the second rotating shaft.

10. The hinge module according to claim 1, wherein the first rotating shaft comprises a first shaft surface and a second shaft surface, a shaft diameter of the first shaft surface is smaller than a shaft diameter of the second shaft surface, the first rotating shaft rotatably passes through the linking member, and the third limiting portion is in contact with the first shaft surface, wherein when the switching member is interfered with the first limiting portion, a side face of the switching member is abutted against the first shaft surface.

11. The hinge module according to claim 1, wherein the second rotating shaft comprises a third shaft surface and a fourth shaft surface, a shaft diameter of the third shaft surface is smaller than a shaft diameter of the fourth shaft surface, wherein when the switching member is interfered with the second limiting portion, another side face of the switching member is abutted against the third shaft surface, and when the switching member is disengaged from the second limiting portion, the another side face of the switching member is abutted against the fourth shaft surface.

12. The hinge module according to claim 1, wherein when the switching member is interfered with the first limiting portion, the first rotating shaft and the linking member form an integral structure, and when the switching member is interfered with the second limiting portion, the second rotating shaft and the linking member form an integral structure.

13. An electronic device comprising:
   a first body;
   a second body; and
   a hinge module assembled to the first body and the second body such that the first body and the second body are opened/closed with respect to each other via the hinge module, the hinge module comprising:
      a first rotating shaft assembled to the first body and comprising a first limiting portion;
      a second rotating shaft having a first end and a second end opposite to each other, wherein the first end is movably and rotatably assembled to the second body, and the second rotating shaft comprises a second limiting portion;
      a linking member, wherein the first rotating shaft is rotatably assembled to the linking member, the second end of the second rotating shaft is connected to the linking member, the first rotating shaft and the second rotating shaft are located in parallel on two opposite sides of the linking member, and the linking member comprises a third limiting portion located on a moving path of the first limiting portion;
      a switching member movably passing through the linking member, wherein the first limiting portion and the second limiting portion are located at two opposite ends of a moving path of the switching member, such that the switching member is interfered with the first limiting portion or the second limiting portion; and
      a transmission couple respectively disposed at the first end of the second rotating shaft and the second body, wherein a rotating motion of the second rotating shaft with respect to the second body is transformed into a rectilinear motion of the second body with respect to the second rotating shaft via the transmission couple,
   wherein the switching member is interfered with the second limiting portion when the first body is closed with respect to the second body, the first rotating shaft is forced and rotated with respect to the linking member in a process of rotating and spreading the first body with respect to the second body, and after the first limiting portion and the second limiting portion are interfered with each other, the first rotating shaft and the linking member are forced and synchronizedly rotated via the second rotating shaft in a same direction to drive the switching member to be disengaged from the second limiting portion and interfered with the first limiting portion, and the second rotating shaft drives the second body to be moved close to the first body via the transmission couple.

14. The electronic device according to claim 13, wherein the first limiting portion is rotated along with the first rotating shaft, and the second limiting portion is not rotated along with the second rotating shaft.

15. The electronic device according to claim 13, wherein the first rotating shaft comprises a first shaft surface and a second shaft surface having different shaft diameters, and the first shaft surface and the second shaft surface form the first limiting portion.

16. The electronic device according to claim 13, wherein the second rotating shaft comprises a third shaft surface and a fourth shaft surface having different shaft diameters, and the third shaft surface and the fourth shaft surface form the second limiting portion.

17. The electronic device according to claim 13, wherein the moving path of the switching member is orthogonal to the first rotating shaft and the second rotating shaft.

18. The electronic device according to claim 13, wherein the second rotating shaft comprises:
   a shaft portion movably and rotatably assembled to the second body; and
   a sleeve member fit around the shaft portion, wherein a portion of the shaft portion and a portion of the sleeve member form the second limiting portion.

19. The electronic device according to claim 18, wherein the sleeve member comprises a protrusion extending to a slide groove of the second body, the shaft portion is moved and rotated along the slide groove, the sleeve member is moved with the shaft portion along the slide groove via the protrusion, and the protrusion stops the sleeve member from rotating along with the shaft portion.

20. The electronic device according to claim 19, wherein different portions of the shaft portion and the portion of the sleeve member form the second limiting portion.

21. The electronic device according to claim 13, wherein the transmission couple comprises a gear rack and a gear coupled to each other, the gear rack is disposed on the second body, and the gear is fit around the second rotating shaft to be rotated along with the second rotating shaft.

22. The electronic device according to claim 13, wherein the first rotating shaft comprises a first shaft surface and a second shaft surface, a shaft diameter of the first shaft surface is smaller than a shaft diameter of the second shaft surface, the first rotating shaft rotatably passes through the linking member, and the third limiting portion is in contact with the first shaft surface, wherein when the switching member is interfered with the first limiting portion, a side face of the switching member is abutted against the first shaft surface.

23. The electronic device according to claim 13, wherein the second rotating shaft comprises a third shaft surface and a fourth shaft surface, a shaft diameter of the third shaft surface is smaller than a shaft diameter of the fourth shaft surface, wherein when the switching member is interfered with the second limiting portion, another side face of the switching member is abutted against the third shaft surface, and when the switching member is disengaged from the second limiting portion, the another side face of the switching member is abutted against the fourth shaft surface.

24. The electronic device according to claim 13, wherein when the switching member is interfered with the first limiting portion, the first rotating shaft and the linking member form an integral structure, and when the switching member is interfered with the second limiting portion, the second rotating shaft and the linking member form an integral structure.

* * * * *